US006369398B1

(12) United States Patent
Gelernt

(10) Patent No.: US 6,369,398 B1
(45) Date of Patent: Apr. 9, 2002

(54) METHOD OF LITHOGRAPHY USING VACUUM ULTRAVIOLET RADIATION

(76) Inventor: Barry Gelernt, 2976 Lexington Cir., Carlsbad, CA (US) 92008

(*) Notice: Subject to any disclaimer, the term of this patent is extended or adjusted under 35 U.S.C. 154(b) by 0 days.

(21) Appl. No.: 09/280,170

(22) Filed: Mar. 29, 1999

(51) Int. Cl.$^7$ .................................................. G03F 7/20
(52) U.S. Cl. ................... 250/492.2; 430/325; 430/311; 430/396
(58) Field of Search ......................... 250/492.2, 492.1; 378/34, 35; 430/325, 311, 396

(56) References Cited

U.S. PATENT DOCUMENTS

| | | | |
|---|---|---|---|
| 5,194,740 A | 3/1993 | Kogelschatz et al. | 250/492.1 |
| 5,499,282 A | 3/1996 | Silfvast | 378/119 |
| 5,500,459 A | 3/1996 | Hagemeyer et al. | 523/300 |
| 5,510,230 A | * 4/1996 | Tennant et al. | 250/492.2 |
| 5,559,338 A | 9/1996 | Elliott et al. | 250/492.1 |
| 5,686,728 A | 11/1997 | Shafer | 250/492.2 |

OTHER PUBLICATIONS

Watanabe, Inn, Zelikoff, "Absorption Coefficients of Oxygen in the Vacuum Ultraviolet", J. Chem. Phys. vol. 21, p. 1026 (1953).
Zaidel', Shreider, "Vacuum Ultraviolet Spectroscopy", pp. 279–285, Ann Arbor–Humphrey Science Publishers, (1970).
Okabe, "Photochemistry of Small Molecules", pp. 177–179, John Wiley & Sons (1978).
Rothschild, "Photolithography at Wavelenghts Below 200nm", Proceedings of SPIE vol 3274 (Jan. 1998).
"Progress Towards Sub–100 nm Lithography at MIT's Lincoln Laboratory", Lambda Phsik (Jul. 1998).
DeJule, "Optical Lithography: 100 nm and Beyond", Semiconductor International (Sep. 1998).
"157 Varieties . . . From the Excimer Technology Leader", Lambda Physik (1998).
"Lambda Physik LPX 200i Series", Lambda Physik (1998).
"NovaLine Litho 193", Lambda Physik (1998).
"$F_2$—Excimer Laser Emission Spectrum (Broadband)", Lambda Physik (1998).

* cited by examiner

Primary Examiner—Kiet T. Nguyen
(74) Attorney, Agent, or Firm—Moser, Patterson & Sheridan LLP; Wan Yee Cheung

(57) ABSTRACT

A method of vacuum ultraviolet (VUV) lithography in which an irradiating wavelength is selected to be in a region of low absorption in air, e.g., one in the vicinity of a local minimum in an oxygen absorption spectrum. In one embodiment, a lithographic exposure wavelength is advantageously selected between 121.0 nm to 122.0 nm, preferably at about 121.6 nm, corresponding to an absorption window in the oxygen spectrum. This method relaxes the otherwise stringent vacuum and inert gas purge requirement imposed on a VUV lithographic tool.

20 Claims, 5 Drawing Sheets

METHOD OF LITHOGRAPHY USING VACUUM ULTRAVIOLET RADIATION

BACKGROUND OF THE DISCLOSURE

1. Field of the Invention

The invention relates generally to a method of vacuum ultraviolet lithography, and in particular, to a method of lithography in which the irradiating wavelength is selected to be in a region of low absorption by air.

2. Description of the Background Art

The fabrication of microelectronics devices typically involves a complicated process sequence requiring hundreds of individual steps performed on semiconductive, dielectric and conductive substrates. Examples of these process steps include oxidation, diffusion, ion implantation, thin film deposition, cleaning, etching and lithography. Lithography and etching are often referred to as pattern transfer steps—a circuit pattern is first transferred to a photosensitive material layer using lithography, and then to the underlying material layer during the subsequent etching step. These processes are well known to one skilled in the art, and details of conventional lithography can be found, for example, in "Introduction to Lithography" by Thompson et al. (ACS 1983) and "Semiconductor Lithography" by Moreau (Plenum Press 1988). Processes related to the fabrication of integrated circuits are discussed in Silicon Processing for the VLSI Era, by Wolf and Tauber (Lattice Press 1986). Each of these references is herein incorporated by reference.

FIG. 1 is a schematic diagram illustrating the basic principle of a lithographic system used in the fabrication of integrated circuits (IC). A source of radiation 110 exposes a radiation sensitive material 160, known as a resist, that has been coated on the substrate surface 180. The resist 160 is typically a polymeric material which undergoes structural or chemical changes upon exposure to the incident radiation. The incident radiation, which is typically of narrow bandwidth, is either provided by conventional light sources such as a mercury lamp, or excimer laser systems such as krypton fluoride (KrF) or argon fluoride (ArF). For example, the bandwidth of the incident radiation may be controlled by the use of an appropriate filter 115. A mask 130, or reticle, is positioned between the light source 110 and the substrate 180 containing the resist layer 160. A typical optical imaging system for photolithography comprises a lens component 120 used to collimate the light, or radiation, to illuminate the mask 130. The light which is transmitted through the mask 130 is subsequently focused by additional imaging optics 140 onto the resist layer 160. The mask 130 contains regions such as 130a that transmit the radiation and regions 130b that block the radiation. A typical mask, for example, consists of a chrome pattern (corresponding to a circuit pattern) that has been formed over a quartz substrate 132. While quartz is transparent to the incident radiation, the chrome pattern prevents the radiation from reaching the resist layer 160. For example, this lithographic exposure step may render the exposed resist region soluble to a chemical in a subsequent developing step, and allows the circuit pattern to be transferred to the resist layer. This pattern transfer process from the mask to the resist layer 160 is analogous to exposing printing paper through a negative in conventional photography. Of course, in modern IC fabrication methods, the dimensions of the patterned features are typically smaller than 0.5 $\mu$m in width, and often considerably less—around 0.25 $\mu$m for state of the art devices.

Efforts are ongoing to develop lithographic systems with increasing resolution in order to meet the demand for faster IC with a higher density of circuitry. This, in turn, has created the need for shorter wavelength radiation sources for lithographic applications, since the resolution of an optical imaging system is directly proportional to the source, or irradiation wavelength. The resolution R of a lithographic imaging system is given by $R = k\lambda/N.A.$, where k is a proportionality constant which is process-dependent, $\lambda$ is the incident wavelength (sometimes referred to as the irradiating, or "actinic" wavelength), and N.A. is the numerical aperture of the imaging optics.

A variety of radiation sources in the visible, ultraviolet (UV), deep ultraviolet (DUV), and X-ray regions of the electromagnetic spectrum are currently used in IC manufacturing or under development. Details relating to these lithographic methods, their advantages and disadvantages, are well known to those skilled in the art. For example, recent commercial lithographic systems have employed exposure or irradiating wavelengths at 436 nm (atomic mercury "G" line), 365 nm (atomic mercury "I" line), 248 nm (KrF) and 193 nm (ArF). While mercury lamps are used as radiation sources for the "G" and "I" lines, pulsed light sources such as rare-gas halide lasers are used to produce radiation at 248 nm and 193 nm for deep ultraviolet (DUV) lithography. Even though the development of production worthy lithographic systems with laser sources is extremely challenging, the basic physics of the lithographic process is well known.

The trend towards developing shorter wavelength systems primarily involves a migration to laser radiation sources. There are many drawbacks, however, to existing laser systems such as shot-to-shot intensity variation, long-term output intensity drift, need for line narrowing, and high maintenance cost. The need for ultra-high purity gases, additional safety requirement for toxic gas handling, coupled with the typically large footprint of the laser system, all add considerable complexities to their adaptation in a cleanroom environment. The cost of the laser light source, which may be as much as $500,000, also contributes significantly to the overall capital cost for such a lithographic tool.

As lithographic development extends into the vacuum ultraviolet (VUV) region, corresponding approximately to wavelength below 1900 Å, another level of complexity arises due to the absorption of short wavelength radiation, which stems primarily from the oxygen present in air. To a first approximation, the absorption of incident radiation by a gaseous medium increases with increasing absorption coefficient, itself dependent upon the wavelength of radiation, the pressure and the path length of the medium. A higher transmitted radiation intensity can be obtained by either working in a non-absorbing medium, or reducing the operating pressure and/or the path length. The path length of a typical lithographic system (for the present discussion, is roughly the distance between the radiation source and the substrate being processed), is primarily dictated by the optical design requirements of a specific lithographic tool. Therefore, in practice, the operation of a VUV lithographic system will involve either inert gas purging or evacuation of the beam path to provide an environment with a reduced oxygen content.

Recently, the fluorine ($F_2$) laser emission at 157 nm has been used for VUV projection patterning experiments. Rothschild et al. (Lambda-Physik publication, July 1998) reported printing 80 nm lines using a simple projection system, a commercial $F_2$ laser source, a chromeless phase shifting mask made of calcium fluoride and top surface imaging resist processing. To overcome oxygen and water vapor absorption, which would dramatically reduce the beam intensity available for resist exposure, the beam path was purged with dry nitrogen. This reference is herein incorporated by reference.

An alternative to gas purging would be evacuation of the beam path. In any case, this vacuum or purging requirement translates to additional processing time for a fabrication step which is already recognized as the throughput "bottleneck" in the IC manufacture process, because unlike most process steps, lithography cannot be performed as a batch process. Therefore, a need exists in the art for alternative light sources or methods of lithography in the VUV region, that can give the requisite submicron pattern resolution, while avoiding lengthy pump-down or purging cycle times.

SUMMARY OF THE INVENTION

The present invention is a method of performing vacuum ultraviolet (VUV) lithography by selecting an irradiating wavelength corresponding to a region of low absorption by air—e.g., in the vicinity of a local minimum in the oxygen absorption spectrum. This method of lithography relaxes the stringent requirement on vacuum or inert atmosphere that is otherwise imposed on the VUV lithographic tool.

In one embodiment, VUV lithography is performed at a wavelength between about 121.0 and 122.0 nm, and most preferably, at about 121.6 nm, such as that available from an atomic hydrogen transition known as the hydrogen Lyman-α emission line. This particular wavelength corresponds closely to a minimum in the oxygen absorption spectrum. The present invention offers the benefit of a less complex lithographic tool by dramatically relaxing the otherwise stringent reduced oxygen requirement. A hydrogen discharge lamp, for example, is a convenient and relatively inexpensive radiation source for generating the hydrogen Lyman-α emission line for practicing this invention.

BRIEF DESCRIPTION OF THE DRAWINGS

The teachings of the present invention can readily be understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
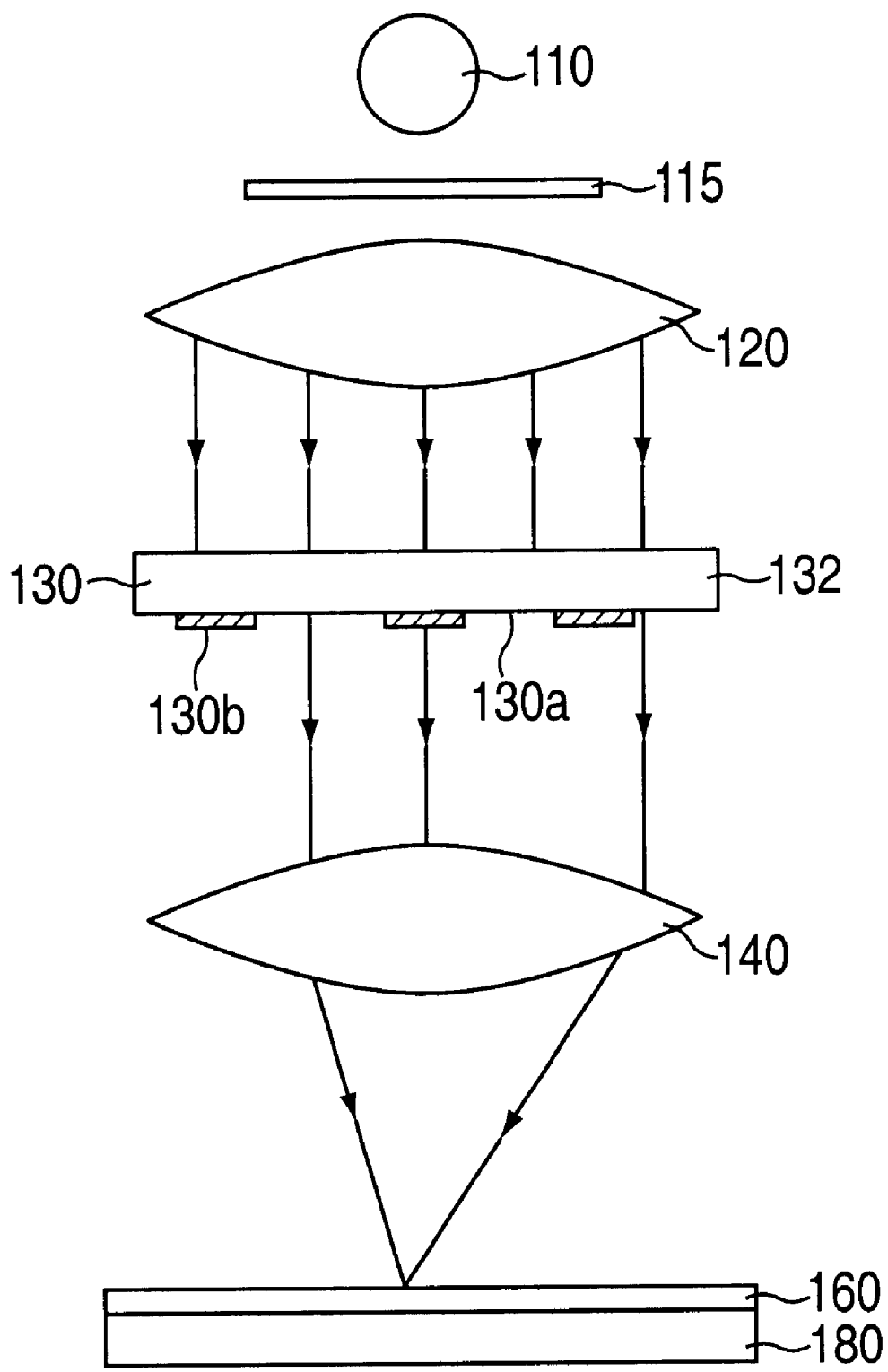
FIG. 1 is a schematic diagram of the optical components in a typical lithographic system.
Figure 2A:
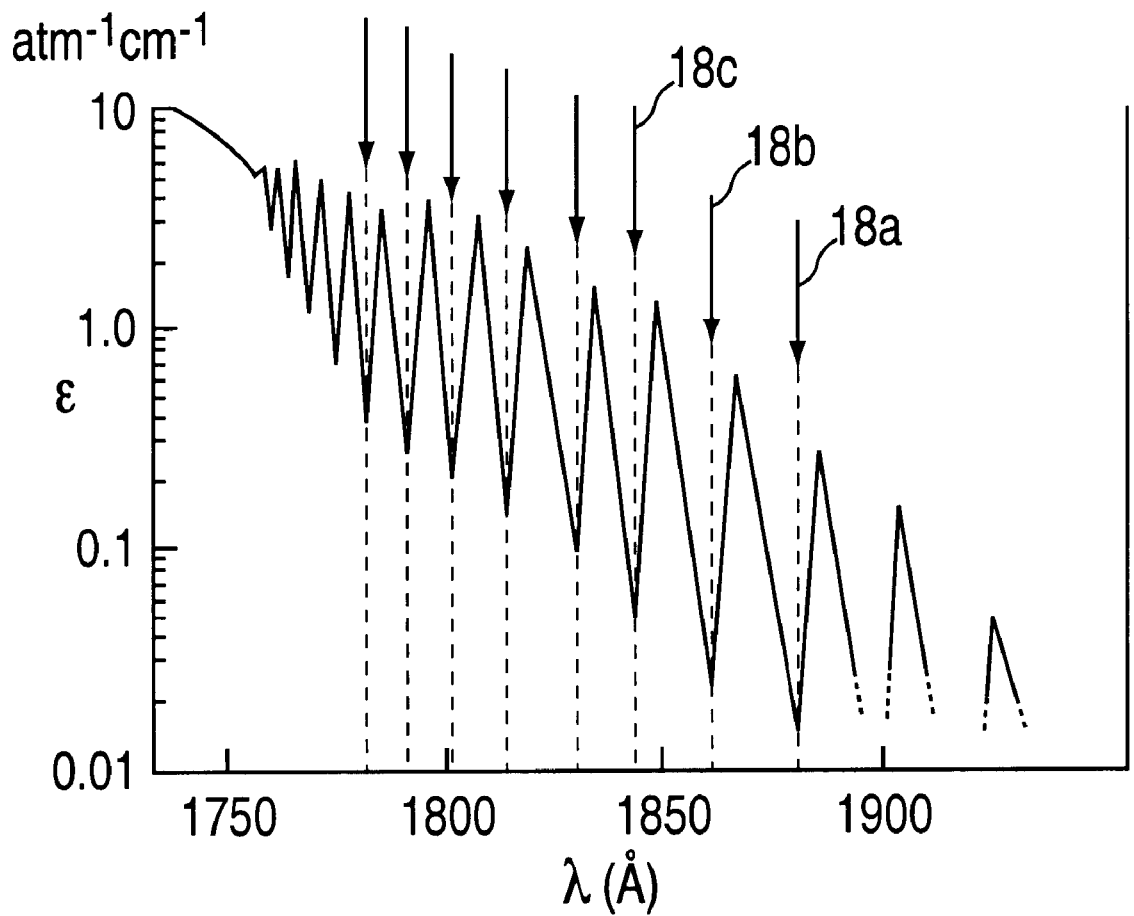
FIG. 2a depicts a plot of the absorption coefficient of oxygen in the wavelength region of 1750 Å–1900 Å.
Figure 2B:
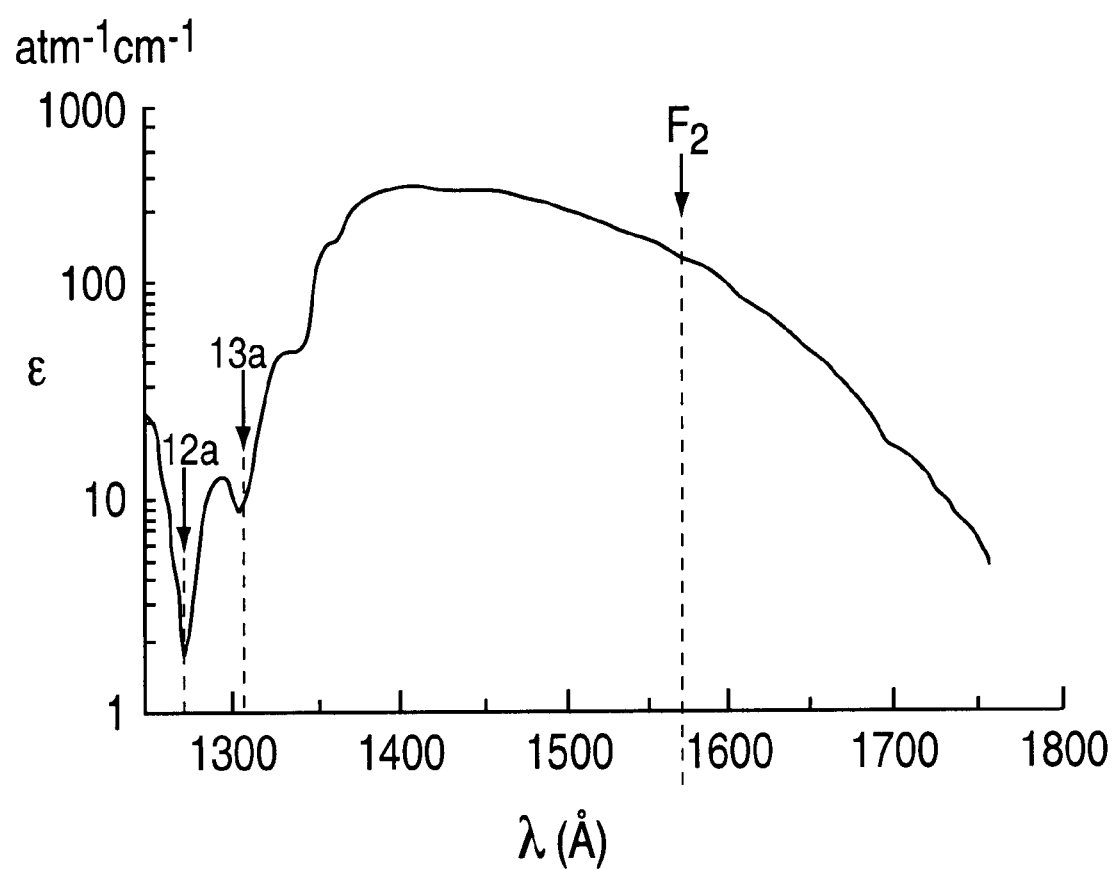
FIG. 2b depicts a plot of the absorption coefficient of oxygen in the wavelength region of 1250 Å–1750 Å.
Figure 2C:
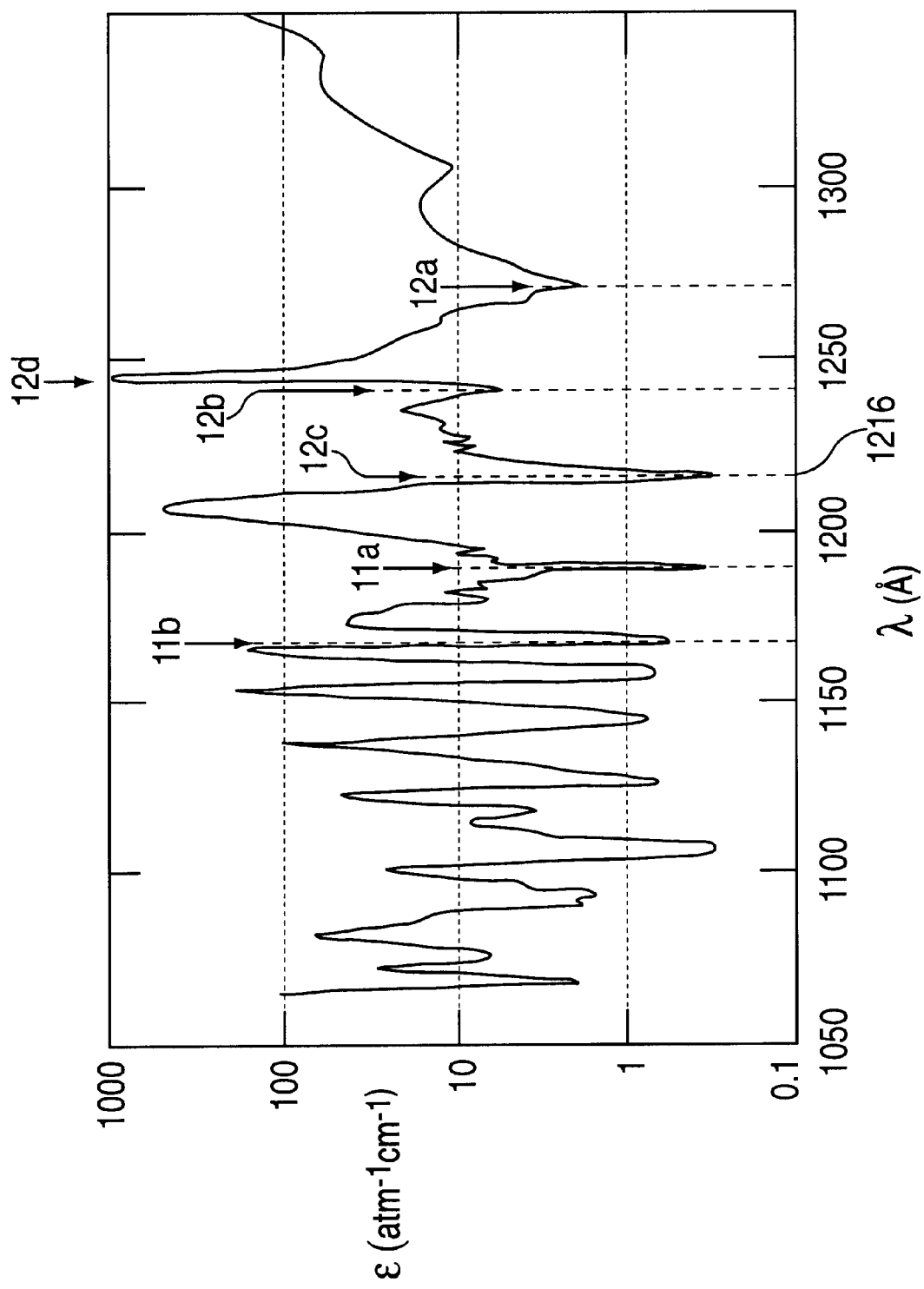
FIG. 2c depicts a plot of the absorption coefficient of oxygen in the wavelength region of 1050 Å–1350 Å.

This invention is a method of performing vacuum ultraviolet (VUV) lithography in which the irradiating wavelength is selected to be in a region of low air absorption. Since air absorption in the VUV region is primarily dominated by absorption due to molecular oxygen ($O_2$), the following discussion uses the $O_2$ absorption spectrum to illustrate the salient features of the present invention, recognizing that there may be other weak absorptions contributed by other species present in air, such as water vapor ($H_2O$) or molecular nitrogen ($N_2$). FIGS. 2a, 2b and 2c illustrate the absorption coefficients of $O_2$ in the wavelength regions of 1750 Å–1900 Å, 1250 Å–1750 Å, and 1050 Å–1350 Å, respectively. The present invention recognizes that VUV lithography may be performed much more efficiently when the irradiating wavelength is selected to closely match a local minimum in the $O_2$ absorption spectrum, instead of the current practice of simply using (or developing) available laser sources without regard to an optimal irradiating wavelength. For example, lithography can be advantageously performed at selected wavelengths such as those marked by arrows 18a, 18b, 18c, 13a, 12a, 12b, 12c, 11a, and 11b, among others. The current trend (or practice) in DUV or VUV lithography is that the irradiating wavelength is dictated by the availability of laser sources, mostly excimer lasers like krypton fluoride (KrF), argon fluoride (ArF) and more recently, the fluorine ($F_2$) laser. As previously mentioned, air absorption becomes a practical issue to be addressed in the VUV region, such as that for $F_2$ at 157 nm.

Using the method of the present invention, one selects the lithographic exposure wavelength so as to minimize intensity attenuation due to air absorption. As shown in FIG. 2b, the absorption coefficient of $O_2$ at the wavelength region indicated by the arrow 12a is approximately 1.5 atm$^{-1}$cm$^{-1}$, which is about two orders of magnitude lower than that of about 200 atm$^{-1}$cm$^{-1}$ at the $F_2$ laser wavelength of 157 nm. The practical implication is that if lithography is performed at an irradiating wavelength around that indicated by the arrow 12a, the otherwise stringent requirement for a high vacuum or inert gas purge system can be relaxed. That is, a reduced pump-down or purging cycle time can be realized in the lithographic tool, leading to an improvement in the process throughput. Therefore, the use of lithographic exposure at wavelengths illustrated by the arrows in FIGS. 2a–2c represents an improved approach to VUV lithography.

Of course, in selecting a specific operating wavelength for lithography in manufacture, one also needs to consider the availability of specific radiation sources. With this consideration in mind, one specific embodiment of the present invention involves a lithographic method which uses an atomic hydrogen (H) emission line at approximately 121.6 nm (1215.670 Å) as the irradiating wavelength (indicated by arrow 12c in FIG. 2c.) This emission line is also referred to as the hydrogen Lyman-α line.

Figure 3:
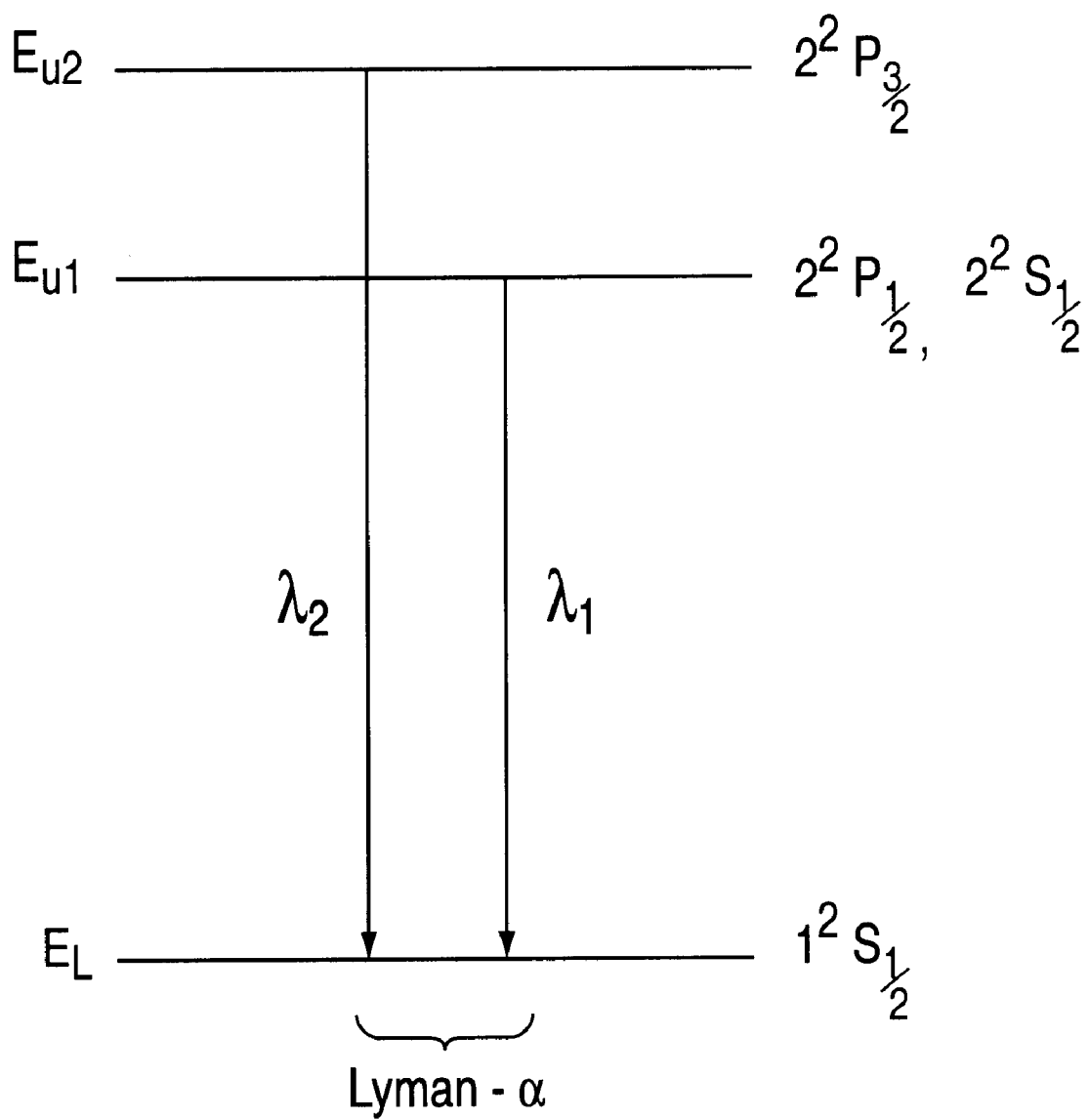
FIG. 3 illustrates a simplified energy level diagram of the atomic hydrogen system.

FIG. 3 illustrates a simplified energy level diagram, showing several electronic states of atomic hydrogen (H). The lowest electronic state, called the ground state, has an energy given by $E_L$. This particular state is denoted by the spectroscopic symbol $1^2S_{1/2}$. The two upper excited states, with energies $E_{U2}$ and $E_{U1}$, are respectively denoted by $2^2P_{3/2}$ and $2^2P_{1/2}$, $2^2S_{1/2}$. When hydrogen atoms in these excited electronic states undergo transitions to a lower state such as the ground state $1^2S_{1/2}$, conservation of energy results in radiation of energy $\Delta E$, corresponding to the energy difference between the upper and lower states. That is, the energy of the emitted radiation is given by $\Delta E = E_U - E_L$, where $E_U$ and $E_L$ represent, respectively, the energies of the upper and lower states. The wavelength of the radiation, $\lambda$, is given by $\lambda = hc/\Delta E$, where h is Planck's constant, and c is the speed of light. In this particular case, the wavelength of the hydrogen Lyman-α radiation is about 121.6 nm. Note that strictly speaking, this atomic hydrogen transition consists of more than one transition, because there are two "nearly degenerate" upper states $E_{U1}$ and $E_{U2}$, which are very close in energy. The transitions from these two upper states $E_{U1}$ and $E_{U2}$ to the lower state $E_L$ give rise to radiation at two wavelengths $\lambda_1$ and $\lambda_2$ around 121.6 nm. To a first approximation, however, one can think of this Lyman-α radiation as having two very closely spaced lines, separated from each other by an energy corresponding to 0.336 cm$^{-1}$ (0.0049 Å). This energy separation will not materially affect the practice of the present invention. In fact, this Lyman-α emission line is very narrow, and VUV lithography performed at this wavelength would not need the line-narrowing optics typically required for excimer laser sources such as KrF and ArF.

The present invention recognizes that there is a narrow "window" in the air absorption spectrum almost exactly at this hydrogen Lyman-α wavelength. It is known to one skilled in the art that hydrogen atomic emission radiation can readily be generated in various types of gas discharges containing hydrogen species. Therefore, the availability of an intense hydrogen Lyman-α emission line at an air absorption window, renders the method of performing VUV lithography at about 121.6 nm highly desirable. This can be further understood by referring to FIG. 2c, which shows that around the absorption minimum, or window, indicated by the arrow 12c at approximately 121.6 nm, the absorption coefficient of oxygen is about 0.30 atm$^{-1}$cm$^{-1}$. Note that this is significantly lower than the corresponding absorption coefficients for 157 nm ($F_2$ laser) and 126 nm ($Ar_2$ laser—another potential candidate for VUV light source)—by as much as two to three orders of magnitude. This difference in absorption coefficients has a direct bearing on the vacuum requirement for a lithographic tool, and a significant relaxation of the vacuum or inert atmosphere requirement can be realized by performing lithography at the wavelength of approximately 121.6 nm.

This advantage can best be understood by considering the transmitted intensity of an incident radiation beam in an absorbing medium. In general, the intensity of a transmitted beam of radiation, $I_t$, is related to the absorption coefficient of a medium by:

$$ln(I_t/I_o) = -\in nx,$$ Equation (1)

where $I_o$ is the incident beam intensity, $\in$ is an absorption coefficient of the medium in atm$^{-1}$cm$^{-1}$, n is the pressure of the absorbing medium in atm, and x is the path length of the absorbing medium in cm. Since $\in$ is a function of wavelength $\lambda$, it is also represented as $\in(\lambda)$ in other parts of this discussion. Using a value of $\in$ of about 0.30 atm$^{-1}$cm$^{-1}$ for oxygen ($O_2$) at a wavelength of about 121.6 nm, Equation (1) yields a transmission of about 5% in a 50 cm path (a reasonable estimate for an effective path length used in a typical lithographic process) in air at a pressure of 1 atm and 0° C. The condition of 1 atm and 0° C. is generally referred to as the standard temperature and pressure (STP). Although the value of $\in$ is temperature dependent, e.g., $\in$ at 25° C. (ambient room temperature) is about 9% less than that at 0° C., this distinction will not be significant as it relates to the practice of the invention. Obviously, given the low transmission of 5% at 1 atm., it is not desirable to perform lithography at the wavelength of 121.6 nm without at least reducing the $O_2$ concentration in the beam path—e.g., by partial evacuation, or dilution by gases such as nitrogen, argon, and so on. For example, if a 50 cm beam path is evacuated to a pressure of about 50 torr of air (or its equivalent $O_2$ concentration by dilution), a transmission of over 80% is obtained; while at about 1 torr, one obtains a transmission of approximately 99.6%. Such moderate vacuum requirement can readily be achieved by the use of a good mechanical pump, which is relatively inexpensive.

Table 1 shows the % transmission of a beam of radiation at 121.6 nm calculated from Equation (1) as a function of pressure at 0° C. (using a value of $\in$=0.30 atm$^{-1}$cm$^{-1}$ for $O_2$ at 121.6 nm, and a path length of 50 cm). Percentage transmission in both $O_2$ and air are shown as a function of pressure. In the case of air, it is recognized that its total absorption contains contribution from all its constituent gases—i.e., $O_2$, nitrogen ($N_2$), water vapor ($H_2O$), and so on. It is assumed, for the calculation shown in Table 1 below, that $O_2$ is the primary absorbing species in air. Therefore, the % transmission for air shown in Table 1 is obtained by factoring in the corresponding fraction of $O_2$ which is present in air (e.g., at a pressure of 1 torr of air, the equivalent pressure of the absorbing medium $O_2$, is about 0.21 torr.)

TABLE 1

| % Transmission of radiation at 121.6 nm | | |
|---|---|---|
| Pressure | % Transmission | |
| (torr) | Oxygen | Air |
| 760 | 3.1E-5 | 4.3 |
| 380 | 5.5E-2 | 20.7 |
| 200 | 1.9 | 43.7 |
| 100 | 13.9 | 66.1 |
| 50 | 37.3 | 81.3 |
| 30 | 55.3 | 88.3 |
| 20 | 67.4 | 92.0 |
| 10 | 82.1 | 95.9 |
| 5 | 90.6 | 97.9 |
| 1 | 98.0 | 99.6 |
| 0.5 | 99.0 | 99.8 |
| 0.1 | 99.8 | 100.0 |

As illustrated in Table 1, the transmission of Lyman-α radiation in air increases from 4.3% at 1 atm. (760 torr) to more than 80% at a pressure below about 50 torr. By contrast, at the $F_2$ laser wavelength of 157 nm, a pressure of about 50 mtorr is required for 50% transmission, and about 1.5 mtorr is required for a transmission of about 99.6% (using an absorption coefficient of about 200 atm$^{-1}$cm$^{-1}$ for $O_2$). Therefore, the use of 157 nm for lithography, especially at higher than 50% transmission intensity, necessitates the use of a high vacuum system, such as that provided by a diffusion pump, or turbomolecular pump, which add both operational complexity and cost to the lithographic tool. Not only does the present invention lead to a less expensive system with reduced complexity, it also results in considerable time-saving in the pump-down or gas purge cycles. This concern for vacuum operation requirements for the $F_2$ laser at 157 nm has also been previously noted in an article entitled "Optical Lithography: 100 nm and Beyond" in Semiconductor International, September 1998. The reference is herein incorporated by reference. Considering that lithography is often the bottle-neck in a device fabrication process, the ability to improve process throughput is a significant advantage of the present invention. Additionally, there is an environmental and safety benefit in performing lithography at a wavelength corresponding to low oxygen absorption. Ozone, a highly toxic gas, and corrosive to many organic materials, is a product of a photochemical reaction when air is irradiated with VUV radiation. By working in a wavelength region where air absorption is negligible, the production of ozone can also be minimized.

Another way that one can appreciate the advantage of selecting lithographic wavelength based on the absorption property of $O_2$ is illustrated in Table 2, which shows the % transmission of radiation as a function of absorption coefficient of $O_2$. Percentage transmissions in $O_2$ and air are shown for pressures corresponding to 50 torr and 1 torr respectively. For illustrative purpose, a path length of 50 cm is used for the calculations shown in Table 2—e.g., at a path length of 50 cm and a pressure of 1 torr (air), % T=exp(−0.0138∈).

TABLE 2

% Transmission of radiation corresponding to different absorption coefficients

| Absorption Coef. of $O_2$ $\epsilon$ (atm$^{-1}$cm$^{-1}$) | % T 50 torr of $O_2$ | % T 1 torr of $O_2$ | % T 50 torr of air | % T 1 torr of air |
|---|---|---|---|---|
| 0.3 | 37.3 | 98.0 | 81.3 | 99.6 |
| 0.5 | 19.3 | 96.8 | 70.8 | 99.3 |
| 1 | 3.7 | 93.6 | 50.1 | 98.6 |
| 3 | 0.0 | 82.1 | 12.6 | 95.9 |
| 5 | 0.0 | 72.0 | 3.2 | 93.3 |
| 7 | 0.0 | 63.1 | 0.8 | 90.8 |
| 10 | 0.0 | 51.8 | 0.1 | 87.1 |
| 15 | 0.0 | 37.3 | 0.0 | 81.3 |
| 20 | 0.0 | 26.8 | 0.0 | 75.9 |
| 25 | 0.0 | 19.3 | 0.0 | 70.8 |
| 30 | 0.0 | 13.9 | 0.0 | 66.1 |
| 50 | 0.0 | 3.7 | 0.0 | 50.1 |
| 100 | 0.0 | 0.1 | 0.0 | 25.1 |

Table 2 shows that at any wavelength λ corresponding to which the absorption coefficient ∈(λ) of $O_2$ is below about 25 atm$^{-1}$cm$^{-1}$, the % transmission in air at 1 torr is greater than about 70%. This relatively high transmission is certainly acceptable for lithographic operation. However, it is preferable that lithography be performed at wavelengths λ having corresponding ∈(λ) of $O_2$ less than 15 or 10 atm$^{-1}$cm$^{-1}$, because the % transmission increases further to over 80% at a pressure of 1 torr of air. At the preferred wavelength of about 121.6 nm, where the corresponding absorption coefficient of $O_2$ is about 0.3 atm$^{-1}$cm$^{-1}$, a transmission of about 99.6% can be obtained at 1 torr in air. Of course, a higher operating pressure will result in a corresponding lower % transmission, and thus longer lithographic exposure time. In general, lithography or processing using VUV radiation can be performed in a range of pressure and path length combinations which are effective (e.g., to allow a desirably high transmission) for processing a specific substrate. Illustratively, the present invention allows a pressure range of up to about 150 torr and a path length between about 10 to 100 cm to be effective for VUV lithography or processing applications.

It should be noted that the practice of the present invention does not depend on the choice of specific operating pressure, temperature, path length, or the propagation medium. Rather, the invention entails a method of performing lithography at irradiating wavelengths λ corresponding to regions of low air absorption. As such, even if the propagation medium is predominantly nitrogen, such as that achieved by nitrogen purging of a stepper, the invention can be practiced as long as the irradiating wavelength λ satisfies the condition of low air (or oxygen) absorption. For example, the irradiating wavelength λ may be determined by examining its corresponding absorption coefficient of $O_2$ (e.g., from FIG. 2c) which would give rise to a desirable % transmission of the exposure radiation according to Equation (1).

As an illustrative example, one embodiment of the present invention can be practiced by generating an irradiating wavelength of about 121.6 nm using a microwave discharge in hydrogen ($H_2$), or $H_2$ diluted in helium. It is common practice to use an inert diluent gas, e.g., argon (Ar), among others, for stabilizing the plasma. The exact dilution ratio and choice of the diluent gas depend on the specific excitation configuration employed, and such optimization procedure is known to one skilled in the art. The generation of atomic hydrogen (H) emission is not limited to gas discharges from molecular hydrogen ($H_2$). Other excitation methods besides gas discharges may also be used in conjunction with other precursor species, as long as these precursor species can serve as a source of atomic hydrogen (H)—i.e., the precursor species is generally recognized to include any species containing the hydrogen element (H-containing). In other words, any excitation methods which can populate hydrogen atoms in the excited states such as $E_{U1}$ or $E_{U2}$, can potentially generate the atomic hydrogen Lyman-α radiation needed for the practice of the present invention. For example, a hydrogen lamp design by P. Warneck disclosed in Appl. Optics, vol. 1, 721 (1962), gave a power output of between $10^{15}$ to $10^{16}$ quanta/sec. This is comparable to the outputs of mercury discharge lamps used for G-line or I-line lithography. Optimization of discharge or excitation sources, which is known to one skilled in the art, can further increase the fluence of the atomic hydrogen Lyman-α radiation. Suffice to say that there is no inherent limitation which would preclude a hydrogen Lyman-α source from providing sufficient dosage necessary for photoresist exposure in lithographic applications.

Although the present embodiment focuses on the use of 121.6 nm as the irradiating wavelength, one realizes from FIGS. 2a–2c that other absorption minima are also present within this VUV region such as those indicated by the arrows 12a, 11a and 11b. That is, the present invention can also be practiced by using irradiating wavelengths in the vicinity of 127.1 nm, 116.7 nm and 118.7 nm, and so on.

Of course, it is not critical that the irradiating wavelengths match exactly the minima of these absorption windows. The key feature is that there be a sufficiently close wavelength match (e.g., a mismatch of less than about 1 nm, and more preferably, less than about 0.5 nm) such that the air absorption remains reasonably low. Therefore, even if the irradiating wavelength is offset from the absorption minimum at 12c, one can still realize the advantage of a relaxed operating vacuum requirement for the lithographic system. This acceptable wavelength range around an absorption minimum necessarily depends on the specific spectral shape. For example, in the vicinity indicated by 12c, a relatively low absorption coefficient is observed over a large wavelength range. With a VUV radiation source, lithography can readily be performed between about 121.0 nm and 122.0 nm, or preferably 121.2 to 121.8 nm, with no significant adverse effect from air absorption. Therefore, an exact wavelength match is less critical around 12c than the case for 12b, where the steep rise to the peak 12d on the longer wavelength side of 12b would require a more exact wavelength match (as far as an upper limit is concerned) to the minimum at 12b. Of course, if one is not concerned about the reduced beam intensity due to air absorption, an even larger wavelength range (or mismatch) may be deemed acceptable for lithographic purpose. The practical trade-off is that a less perfect wavelength match to an absorption minimum will lead to an increased exposure time required in the lithographic step, and thus a reduced process throughput. In the absence of readily available intense tunable VUV radiation sources, a lithographic method which selects irradiating wavelengths based on matching air (or $O_2$) absorption minima offers an attractive alternative, especially when the irradiating emission source is relatively inexpensive and readily available, such as that of a discharge lamp.

In general, many alternative approaches can be used to produce different radiation wavelengths including microwave, DC, RF, or laser-produced plasmas. The use of other radiation sources does not detract from the spirit of the present invention, which lies in recognizing the ability to overcome the air absorption problem by a judicious choice of irradiating wavelength for the lithographic process.

Although the atomic hydrogen Lyman-α line is used as an example of a preferred embodiment, the approach proposed is generally applicable to other atomic or even molecular transitions, as long as the transition wavelength closely matches that of, or is in the vicinity of, a minimum in the oxygen or air absorption spectrum. (The energy levels of a molecular system are more complicated than that of an atomic system, but the essential idea of an emission wavelength remains the same.)

It is noted that the present invention also encompasses the use of isotopic species as the radiating source. In some cases, this may lead to a better matching between the radiation wavelength and the minima in the air absorption spectrum. It is well-known that isotopic substitution may lead to a shift in the energy of transition. The magnitude of this isotopic shift in wavelength depends on the specific radiating species as well as the specific transition involved. For example, a molecular transition tends to have a larger isotopic shift compared to an atomic transition. Under some circumstances, one may be able to use isotopic substitution to optimize the matching between the irradiating wavelength and an absorption minimum. Therefore, the present invention is not limited to any particular isotope for the radiating species. For example, the use of a deuterium-containing discharge to generate the corresponding atomic deuterium (D) Lyman-α emission line (at about 1215.338 Å) is also envisioned by the present invention.

Of course, to achieve the ultimate feature size resolution desired for sub-0.25 μm device manufacture purpose, other advances in lithographic processing such as improved resist materials and optical imaging systems have to be developed and optimized for commercial viability.

Resist materials that are currently in use for 193 nm investigations include various chemically amplified resists, which are either acrylic or cyclic olefinic polymers. They are discussed in the article "Optical Lithography: 100 nm and Beyond" in Semiconductor International, September 1998, herein incorporated by reference. From a lithographic feasibility view point, one requirement for the resist material is sufficient photosensitivity at the appropriate exposure wavelength. Those used for 193 nm lithography, for example, would be viable candidates for use at 121.6 nm as well. Of course, to provide an optimal pattern transfer process for manufacture purpose, it is likely that these and other resist materials have to be modified for use with the Lyman-α radiation, to ensure optimization both for the lithographic and etching steps. Just as surface imaging techniques have proved feasible for the 157 nm experiments, similar resist processing approaches would be viable when used in conjunction with the higher energy radiation (e.g., 121.6 nm) of the present invention.

In general, lithographic exposure tools can utilize either transmissive and/or reflective optics. Materials that may be suitable as transmissive optical components (mask and lenses) in the hydrogen Lyman-α region include lithium fluoride and magnesium fluoride. Alternatively, a lithographic system using reflective optics may allow one to avoid some of the problems or expense in working with lithium fluoride or magnesium fluoride optical components. A projection lithography system using all-reflective optical elements has been disclosed in U.S. Pat. No. 5,686,728 issued on Nov. 11, 1997; and is herein incorporated by reference. Such a system, for example, can be used in conjunction with the present invention to perform VUV lithography.

Although most lithographic processes used in IC fabrication rely on the use of a reticle or mask for pattern transfer, another variation uses a "direct write" approach, in which the desired pattern can be written or transferred to the radiation-sensitive material by moving the incident radiation beam across the material surface. Obviously, the present invention can readily be applied to these maskless process as well. Furthermore, this invention is not limited to lithography for IC fabrication. Instead, other technologies such as nano-device fabrication and similar micro-machining applications requiring the use of VUV radiation for processing will find this invention applicable.

Although various embodiments which incorporate the teachings of the present invention have been shown and described in detail herein, those skilled in the art can readily devise many other varied embodiments that still incorporate these teachings.

What is claimed is:

1. A method of processing a substrate in a medium comprising the step of exposing said substrate to vacuum ultraviolet (VUV) radiation comprising a wavelength $\lambda$ whose corresponding oxygen absorption coefficient, $\in(\lambda)$, satisfies an equation: $e^{-\in(\lambda)nx} \geq 0.7$; wherein n and x represent, respectively, pressure and path length which are effective for processing said substrate in said medium.

2. The method of claim 1, wherein said wavelength $\lambda$ is defined by a corresponding $\in(\lambda)$ of oxygen satisfying an equation $e^{-\in(\lambda)nx} \geq 0.7$; wherein nx is equal to about 0.0138 $atm^{-1}cm^{-1}$.

3. The method as in claim 1 further comprising the step of forming a radiation-sensitive material layer upon said substrate prior to said exposing step.

4. The method as in claim 3, wherein said exposing step comprises passing said vacuum ultraviolet radiation through a mask containing a pattern and transferring said pattern into said radiation-sensitive material.

5. The method as in claim 1, wherein said vacuum ultraviolet radiation further comprises a wavelength in the vicinity of a minimum in oxygen absorption spectrum.

6. The method as in claim 1, wherein said vacuum ultraviolet radiation is provided by a hydrogen-containing or deuterium-containing source.

7. The method as in claim 1, wherein said vacuum ultraviolet radiation wavelength is between about 121.0 to 122.0 nm.

8. The method as in claim 7, wherein said radiation is generated in a gas discharge.

9. A method of processing a substrate comprising the step of exposing said substrate to vacuum ultraviolet (VUV) radiation comprising a wavelength $\lambda$ whose corresponding absorption coefficient of oxygen ($O_2$) is less than about 25 $atm^{-1}cm^{-1}$ at standard temperature and pressure (STP).

10. The method of claim 9, wherein said wavelength $\lambda$ has a corresponding absorption coefficient of $O_2$ less than about 10 $atm^{-1}cm^{-1}$ at STP.

11. The method as in claim 10, wherein said irradiating wavelength is provided by a radiation source comprising atomic hydrogen (H) or deuterium (D).

12. A method of lithography comprising the steps of:
   (a) forming a radiation-sensitive material upon a substrate; and (b) exposing said radiation-sensitive material to vacuum ultraviolet (VUV) radiation comprising a wavelength λ whose corresponding absorption coefficient of oxygen ($O_2$) at standard temperature and pressure (STP) is less than about 25 $atm^{-1}cm^{-1}$.

13. The method as in claim 12, wherein said step (b) further comprises passing said VUV radiation through a mask containing a pattern and transferring said pattern into said radiation-sensitive material.

14. The method as in claim 12 wherein said VUV radiation comprises a wavelength in the vicinity of a minimum in oxygen absorption spectrum.

15. The method as in claim 14 wherein said wavelength has a corresponding oxygen absorption coefficient of less than about 10 $atm^{-1}cm^{-1}$ at STP.

16. The method as in claim 12, wherein said vacuum ultraviolet radiation is provided by a hydrogen-containing or deuterium-containing source.

17. The method as in claim 16, wherein said radiation is generated in a gas discharge.

18. The method as in claim 12, wherein said vacuum ultraviolet radiation wavelength is between about 121.0 nm to 122.0 nm.

19. A method of lithography comprising:
(a) providing a radiation-sensitive material; and
(b) exposing said radiation-sensitive material to vacuum ultraviolet radiation having an irradiating wavelength λ, whose corresponding absorption coefficient of oxygen ($O_2$) at standard temperature and pressure (STP) is less than about 10 $atm^{-1}cm^{-1}$.

20. A method of integrated circuit fabrication comprising the steps of:

forming a first material layer over a substrate;

forming a second material layer over said first material layer, said second material layer being sensitive to vacuum ultraviolet radiation;

exposing said second material layer to vacuum ultraviolet (VUV) radiation through a mask containing a pattern to be transferred to said first material layer, wherein said VUV radiation comprises a wavelength λ whose corresponding absorption coefficient of oxygen ($O_2$) is less than about 10 $atm^{-1}cm^{-1}$ at standard temperature and pressure (STP);

developing said exposed second material layer so as to transfer said pattern in said mask into said second material layer;

performing an etching step to transfer said pattern into said first material layer; and performing additional steps such as film deposition, doping or implant to fabricate said integrated circuit.

* * * * *